United States Patent [19]
Seligson et al.

[11] Patent Number: 5,333,166
[45] Date of Patent: Jul. 26, 1994

[54] SELF-APODIZING COLLIMATOR FOR X-RAY LITHOGRAPHY

[75] Inventors: Daniel Seligson, Palo Alto; Jeffrey Kidder, Fremont, both of Calif.

[73] Assignee: Intel Corporation, Santa Clara, Calif.

[21] Appl. No.: 937,302

[22] Filed: Aug. 28, 1992

[51] Int. Cl.⁵ ............................................. G21K 5/00
[52] U.S. Cl. .................................... 378/34; 378/84; 378/85; 378/147
[58] Field of Search ................... 378/84, 85, 34, 147

[56] References Cited

U.S. PATENT DOCUMENTS

| | | | |
|---|---|---|---|
| 4,727,000 | 2/1988 | Ovshinsky et al. | 378/84 |
| 5,214,685 | 5/1993 | Howells | 378/84 |

Primary Examiner—Craig E. Church
Attorney, Agent, or Firm—Blakely Sokoloff Taylor & Zafman

[57] ABSTRACT

A self-apodizing collimator for collimating X-rays for use in VLSI lithography. The paraboloidal collimator uses a graded ML coating to collimate a range of wavelengths along the surface of the paraboloid such that a uniform resist response is provided. In addition, the collimated X-rays have a higher intensity than possible with a system using additional apodizing films.

29 Claims, 2 Drawing Sheets

SELF-APODIZING COLLIMATOR FOR X-RAY LITHOGRAPHY

BACKGROUND OF THE INVENTION

1. Field of the Invention

The present invention relates generally to the field of X-ray optics and more specifically to an improved synthetic multilayer collimator useful for X-ray lithography in modern semiconductor processing.

2. Prior Art

The following are United States patents that are related to the present invention. U.S. Pat. No. 4,200,395 teaches a method for precision alignment of two layers for X-ray lithography. U.S. Pat. No. 3,743,842 teaches an apparatus and method for X-ray lithography using an electron gun as the X-ray source. U.S. Pat. No. 3,984,680 teaches an apparatus for alignment of two layers in a soft X-ray lithography system.

X-ray lithography requires an illumination source whose wavelength, λ, is between 4 and 20 A. The source must be intense, small in extent (as viewed from the resist plane), of low angular divergence, well collimated, and must produce a uniform resist response. Synchrotrons satisfy all of these requirements, but researchers and manufacturers alike have sought to find physically more compact alternatives. These alternatives are generally called point sources, and the best candidate among them is the laser produced plasma source (LPP).

A problem common to all point sources is that they radiate nearly isotropically. Consequently, satisfactory collimation, or making parallel, is usually achieved by placing the lithography mask relatively far away from the point source, or making the mask field small. In other words, the mask must subtend a small solid angle, Ω, leaving most of the isotropically generated radiation unavailable for productive use. This is undesirable due to the high cost of generating X-rays using a LPP source.

Collimating the isotropic X-rays from the LPP source allows better control of the pattern to be defined by lithography and utilizes the LPP produced X-rays more efficiently. One solution for collimating light from a point source is to place the point source at the focus of a paraboloidal reflector, thereby collecting and redirecting the light. Unfortunately, there are no known materials which in their naturally occurring form can be used as high efficiency reflectors in the X-ray wavelength region.

For nearly 20 years, researchers have been advancing a technology called synthetic multilayer reflectors' (ML). MLs are one-dimensional arrays of thin films of alternately high and low index of refraction. They constitute Bragg scatterers whose characteristic spacing, the d-spacing, is engineered to produce good reflectivity at near normal angles of incidence in the X-ray wavelength region. The Bragg condition is $$\sin\theta = \lambda/2d \qquad \text{EQ 1}$$

where θ is the angle of grazing incidence, λ is the wavelength, and d is the combined thickness of the two alternating thin film layers.

Fabrication of MLs is accomplished by using a two material sputtering system to deposit thin films on a substrate. For example, a constant d-spacing ML is fabricated using a flat substrate and repeatedly depositing alternating thin film layers of 20 A tungsten and 28 A carbon. The d-spacing for this ML is 48 A, the combined thickness of the alternating tungsten and carbon layers. Other thin film materials that are commonly alternated to produce MLs are molybdenum/silicon and rhodium/carbon.

A paraboloidal surface coated with a constant d-spacing ML will only behave as a good reflector and hence as a good collimator within the small range in which the Bragg condition is satisfied. If the point source is located at the focus of a paraboloidal reflector, the angle of incidence of the outgoing rays will vary as a function of axial position along the reflector. In order to achieve good reflection at all axial points, the d-spacing must vary with axial position according to Bragg's law (EQ 1).

For this reason attempts have been made to construct a paraboloidal collimator using a graded ML. Grading means that the d-spacing is varied, or graded, as a function of the axial position on the paraboloidal surface. The grading curve d(x) is chosen so that the Bragg condition is satisfied at every point for a single wavelength of X-rays from the point source.

This type of paraboloidal collimator will produce collimated light, but will not produce uniform intensity in a plane perpendicular to the collimated X-rays. The principal reason for this is that in the perpendicular plane, parameterized by the axial distance x, a length element dx subtends a solid angle which is itself a function of x. That is, $d\Omega = d\Omega(x)$. For a paraboloid with constant reflectivity R, the collimated intensity in the perpendicular plane is $$C(x) = \frac{8RI_0}{\pi}\left(\frac{\alpha}{x^2 + 4\alpha^2}\right)^2 \qquad \text{EQ 2}$$

where α is the focal length of the paraboloid and $I_0$ is the source intensity into 2π steradians. Depending on the design parameters, the intensity variation across the perpendicular plane field may be greater than 100% of its minimum value. Therefore, the geometry of a paraboloidal collimator causes intensity variation of the collimated X-rays.

When using a collimator in a lithography system, the resist lies in a plane perpendicular to the collimated X-rays. The resist response or absorbed dose rate is dependent on the wavelength-dependent absorption of the resist and the intensity of the collimated X-rays. Therefore, either the geometry of a paraboloidal collimator or wavelength variation in the collimated X-rays can produce a non-uniform resist response.

Uniform resist response is required for VLSI lithography. In addition, due to the high cost of producing X-rays using a LPP, preserving the intensity of the collimated LPP X-rays improves the economic viability of collimated LPP X-ray technology for VLSI lithography. Therefore, there is a need for an X-ray collimator that provides a uniform resist response while also providing high intensity collimated X-rays.

SUMMARY OF THE INVENTION

A collimator is described which collimates radiation of a predetermined range of wavelengths. The collimator includes a radiation source means for providing the radiation and a collimator means for collimating the radiation such that the collimated radiation has a uniform dose rate.

One advantage of the collimator of the present invention is that it apodizes (makes the intensity uniform) the collimated radiation without the use of additional apodizing films or plates. The collimator of the present invention is, therefore, self-apodizing.

Another advantage of the collimator of the present invention is that it provides higher intensity X-rays than a collimator requiring apodizing films or plates. Additional apodizing films or plates in a collimator system make the collimated radiation of a uniform intensity equal to or less than the lowest intensity of the collimated radiation. The self-apodizing collimator of the present invention requires no additional apodizing films or plates and, therefore, provides X-rays having a higher uniform intensity than previous collimators.

DETAILED DESCRIPTION OF THE PREFERRED EMBODIMENT

A self-apodizing collimator that provides high intensity collimated X-rays while also providing uniform resist response is described. In the following description, numerous specific details are set forth, such as specific wavelengths and design equations, in order to provide a thorough understanding of the present invention. It will be apparent, however, to one skilled in the art that the present invention may be practiced without these specific details. In other instances, well-known devices and fabrication processes are not described in detail in order not to obscure the present invention.

The geometry of a paraboloidal collimator causes intensity variation of the collimated X-rays. The resist response in a lithography system depends on both the intensity and the wavelength of the collimated X-rays.

Since uniformity of resist response is required for VLSI lithography, some additional methods must be employed to provide a satisfactory collimator for VLSI X-ray lithography. One method is to place between the collimator and the resist plane a thin membrane with a graded thickness absorber, designed in such a way as to compensate for the intensity gradient introduced by the collimator geometry. Such a thin membrane compensating plate, or apodizer, makes the intensity uniform but low; equal to its value at the low intensity side of the image field in the absence of the apodizing membrane. Furthermore, the thin membrane introduces some additional attenuation.

A second method consists of putting a thin absorbing coating on the collimator itself. This apodizing coating avoids the attenuation through the apodizing membrane, but otherwise suffers from the same problem of making the illumination uniform but of the lowest intensity.

The preferred embodiment of the present invention provides a collimator that produces uniform resist response while preserving the intensity of the X-rays.

Figure 1:
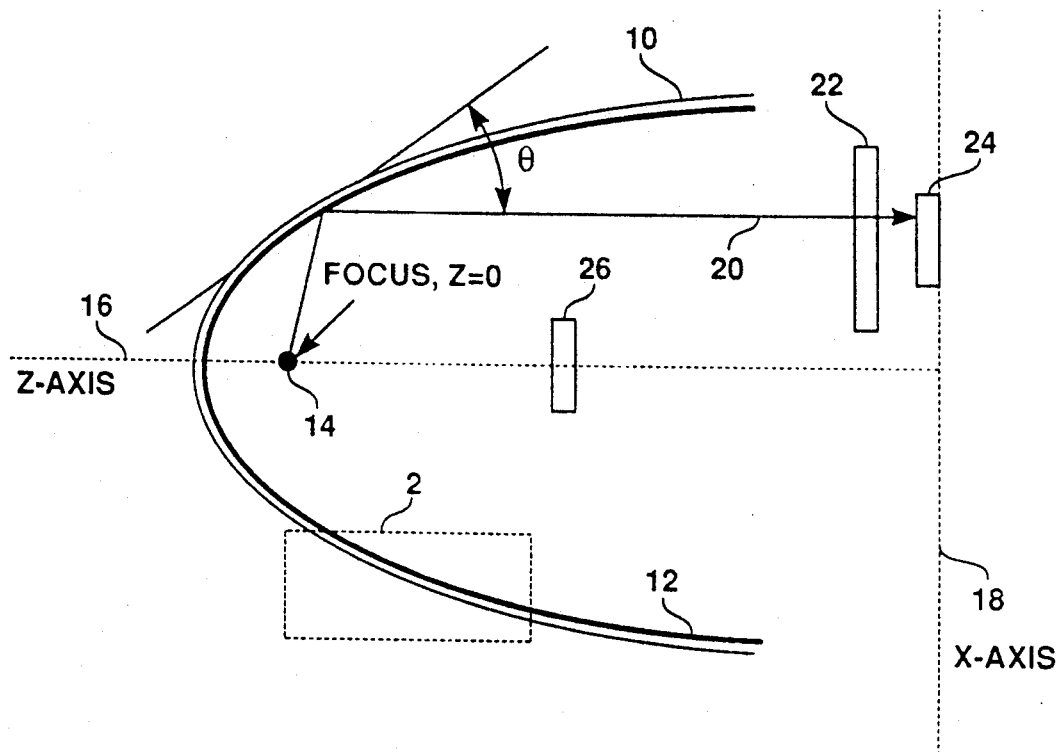
FIG. 1 is a cross-section of the preferred embodiment of the collimator of the present invention.

FIG. 1 illustrates a cross-section of the preferred embodiment of the collimator of the present invention. FIG. 1 is a cross-section of a paraboloid 10 coated with a graded ML coating 12 made of alternating thin film layers of tungsten and carbon for collimating X-rays from an isotropic point source 14. Point source 14 is placed at the focus of paraboloid 10 which is along the z-axis (symmetry axis) 16. The x-axis 18 is perpendicular to the z-axis. The plane through the x-axis perpendicular to the z-axis forms the resist plane for X-ray lithography. Collimated X-rays 20 are selectively transmitted through lithography mask 22 to semiconductor wafer 24 which is coated with an X-ray sensitive resist. The selective transmission of X-rays to the resist and ensuing chemistry and physics of absorption defines a latent image in the resist. Obstructing barrier 26 prevents uncollimated X-rays from point source 14 from reaching wafer 24. Box 2 defines the cross-sectional view of graded ML coating 12 in FIG. 2.

Two aspects of X-ray lithography have previously been ignored. First is the finite bandwidth of the LPP source. Its spectral intensity per unit wavelength typically has a form approximated by $$i(\lambda) = \frac{\sigma^2}{(\lambda - \lambda_0)^2 + \sigma^2} \quad \text{EQ 3}$$

if normalized to a value of 1 at its peak. The peak of the spectrum occurs at $\lambda_0$ and $\sigma$ is its halfwidth. Second, the resist response depends uniquely on the absorbed dose density D, $$D = \int I(\lambda)A(\lambda)d\lambda dt \quad \text{EQ 4}$$

where $I(\lambda)$ is the wavelength-dependent intensity incident on the resist, and the integral is performed over wavelength, $\lambda$. The wavelength-dependent x-ray absorption in the resist, $A(\lambda)$, expressed in units of energy per unit volume, is well understood, varying with $\lambda^n$, where n is approximately 3, except near absorption edges.

The collimator of the present invention exploits these previously ignored aspects of X-ray lithography to produce collimated X-rays of higher intensity than previously possible while also providing uniform resist response. Instead of using a graded ML that satisfies the Bragg condition for a single wavelength of X-ray, the present invention uses a graded ML that selects different wavelengths of X-rays according to axial position on the collimator to satisfy the Bragg condition. The multiple wavelength graded ML collimator of the present invention provides high intensity collimated X-rays and a uniform resist response.

Figure 2:
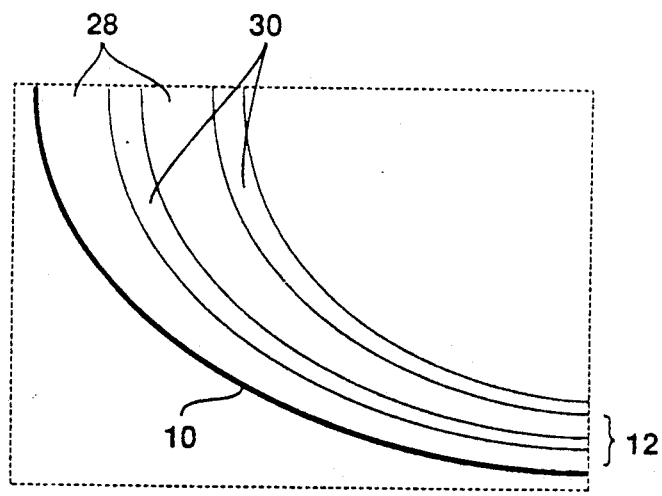
FIG. 2 is a cross-section as defined by box 2 in FIG. 1.

FIG. 2 is the cross-sectional view of the graded ML coating 12 defined by box 2 in FIG. 1. Like numbers in FIGS. 1 and 2 define the same elements in each figure. Paraboloid 10 is coated with alternating thin film layers of carbon 28 and tungsten 30 which in combination form graded ML coating 12. The d-spacing of graded ML coating 12 is varied such that X-rays of a given wavelength and angle of incidence are reflected at each point along the surface of paraboloid 10. Other combinations of thin film materials such as molybdenum/silicon and rhodium/carbon can be used in place of carbon/tungsten to produce graded ML coating 12.

In providing a uniform resist response, the collimator of the present invention accounts for wavelength dependence of the following factors: (1) illumination intensity, $i(\lambda)$ as in EQ 3, (2) ML coating reflectivity, $R(\lambda)$, (3) transmission through the lithography mask membrane, $T(\lambda)$, and (4) absorption in the resist, $A(\lambda)$. The collimator of the present invention utilizes the previously ignored fact that LPP sources produce a spectrum of X-ray wavelengths along with these wavelength dependent factors of X-ray lithography to provide collimated X-rays of higher intensity than previously possible while also providing a uniform resist response.

Along with the wavelength dependent aspects, the present invention also accounts for the spatial dependence of the collimator throughput, $C(x)$ as in EQ 2, to provide a uniform dose to the resist. In other words, $$D(x) = \int i(\lambda) R(\lambda,x) T(\lambda) C(x) A(\lambda) d\lambda = \text{constant}. \qquad \text{EQ 5}$$

With the exception of $C(x)$, all of these quantities are material dependent. For a non-lithography application, $A(\lambda)$ and $T(\lambda)$ could be removed from EQ 5 to achieve a collimator that provides X-rays of uniform dose rate without considering transmission through a mask or absorption in a resist. Representative quantities are now given for the preferred embodiment of the present invention utilizing specific materials. However, the present invention is generally applicable to other materials and designs.

EXAMPLE 1

Functional forms for each of the terms of EQ 5 are now provided for the parabolic collimator design of the preferred embodiment of the present invention.

$i(\lambda)$, the illumination intensity of the LPP X-ray source, was previously specified in EQ 3.

$R(\lambda)$, the reflectivity of the ML coating, is defined as $$R(\lambda,x) = R_0 \delta(\lambda - \lambda_d) H(d - d_{min}) \qquad \text{EQ 6}$$

where $R_0$ is the magnitude of the reflectivity and $\delta(\lambda - \lambda_d)$ is a delta function peaked at the wavelength $\lambda_d$ set by the Bragg condition. A technology constraint is imposed by using the Heaviside function (1 when its argument is positive and 0 otherwise). Today's state of the art ML fabrication processes have minimum d-spacings, $d_{min}$ of about 20 A. The minimum d-spacing is limited by the ability to fabricate smooth, defect free films. As a reminder, $\lambda_d = \lambda_d(x)$ for a graded multilayer ML design. The functional form given for $R(\lambda)$ is not limiting. It is merely convenient, since detailed prescriptions of $R(\lambda)$ are dependent on fabrication-specific considerations of a specific design.

$T(\lambda)$, the lithography mask transmissivity, is determined by Beer's Law and the wavelength-dependent absorption coefficient of the lithography mask membrane, $\mu_m(\lambda)$.

$$T(\lambda) = e^{-\mu_m(\lambda)} \qquad \text{EQ 7}$$

For simplicity, the membrane's thickness has been incorporated into $\mu_m(\lambda)$. A wide range of design considerations affects the absorption, but when using materials such as Si, SiC, or diamond, a reasonable approach is to set $T(\lambda) = 0.5$ at the peak of the spectrum. Therefore, EQ 7 becomes $$T(\lambda) = 2^{-\left(\frac{\lambda}{\lambda_0}\right)^3} \qquad \text{EQ 8}$$

approximating the wavelength dependence by $\mu_m(\lambda) = \lambda^3$ and defining $\lambda_0$ such that $T(\lambda_0) = 0.5$, where $\lambda_0$ is the peak of the spectrum as given by $i(\lambda)$ in EQ 3. For LPP sources with spectra peaked at $\lambda_0 = 14$ A, the validity of this wavelength approximation is particularly good for Si-based and C-based masks. Detailed knowledge of $\mu_m(\lambda)$ can be inserted if necessary, without invalidating the method.

$A(\lambda)$, the absorption in the resist, is computed by $$A(\lambda) = \lim_{t \to 0} \frac{1 - e^{-\mu_r(\lambda) t}}{t} = \mu_r(\lambda) \qquad \text{EQ 9}$$

which is just the wavelength-dependent absorption coefficient of the resist. Again, the wavelength dependence is approximately $\lambda^3$. For typical resist materials this is a good approximation. The absorption coefficient therefore becomes $$A(\lambda) = \mu_c \left(\frac{\lambda}{\lambda_c}\right)^3 \qquad \text{EQ 10}$$

where $\lambda_c$ is a wavelength which is characteristic of the system.

Additional constraints exist. First, there is a field size requirement. In order to be practical, the field size of the collimated X-rays incident on the resist plane must be large enough for VLSI chips. The preferred embodiment assumes a maximum field size of 20 mm on a side. However, other field size choices are within the scope of the present invention. Second, as mentioned above, there is a technology constraint on $d_{min}$, the minimum d-spacing allowed by ML technology. Effectively, this excludes designs which have large maximum angle of incidence or small focal length. This has been included explicitly in the definition of $R(\lambda)$ by inclusion of the Heaviside function, $H(d - d_{min})$.

EXAMPLE 2

A graphical method can be used to solve EQ 5 for the grading curve $d(x)$ such that the absorbed dose density $D(x)$ is constant and independent of x. In the preferred embodiment of the present invention the following design method is used.

First, a paraboloid is chosen with a given focal length $\alpha$ and EQ 5 is solved incorporating EQ 3, EQ 6, EQ 8, and EQ 10 to produce a constant contour plot of $D(x)$.

Figure 3:
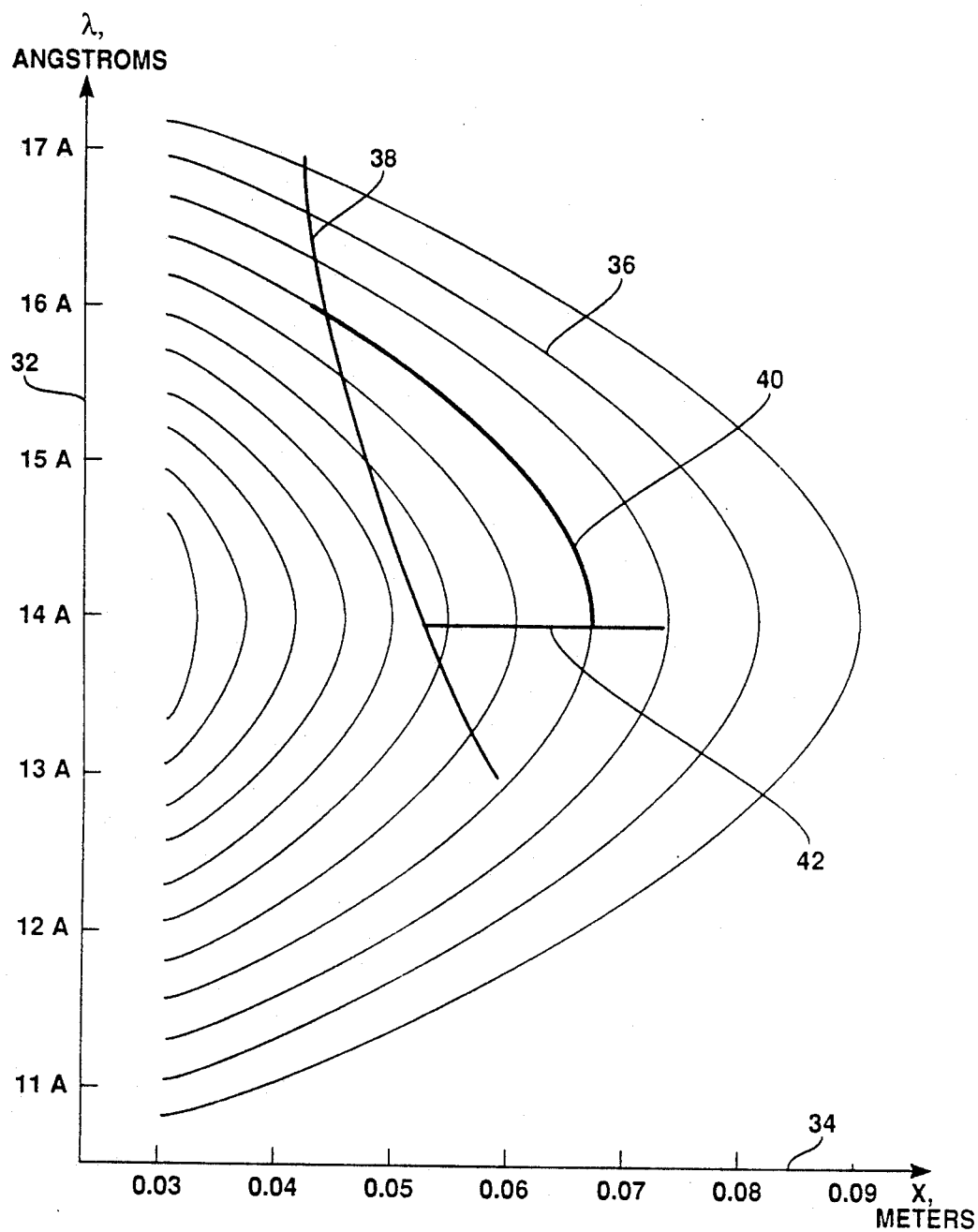
FIG. 3 is a constant contour plot for resist dose, D(x), for the preferred embodiment of the present invention.

FIG. 3 is a constant contour plot of $D(x)$ where the vertical axis 32 is $\lambda$, the wavelength of the LPP source X-rays, and the horizontal axis 34 is x, the distance from the symmetry axis of the paraboloid. Each contour line 36 represents a unique constant value for the absorbed resist dose density, $D(x)$. The contour lines 36 specify $\lambda_d(x)$ satisfying $D(x) = \text{constant}$. Adjacent contours differ in ratio by a factor of the square root of 2, where contours to the left have higher values. The $d_{min}$ curve 38 represents the minimum ML d-spacing technology constraint. Values to the right of $d_{min}$ curve 38 have d-spacings greater than $d_{min}$ meaning that the required ML coating is manufacturable using current ML technology.

To maximize efficiency of the collimator, the greatest constant value contour satisfying the constraint that the difference between $x_{max}$ (its maximum x value) and $x_{min}$ (its x value corresponding to its intersection with the $d_{min}$ curve 38) is greater than or equal to the minimum field size requirement is selected. Using this approach, the darkened portion of contour line 40 defines $\lambda_d(X)$ for the 20 mm field size of the preferred embodiment of the present invention.

The selected contour line 40 defines $\lambda_d(x)$ for the design such that $D(x) = $ constant. The $d(x)$ grading curve is then computed using Bragg's Law, EQ 1.

Some benefits of the present invention over the prior art are now discussed. In the prior art approach, a single value of $\lambda$ is selected. Thus in FIG. 3, $\lambda(x)$ curve 42 is a horizontal line terminating on the left hand side at the contour intersecting the technology constraint (specifying $d_{min}$) and extending to the right such that the field size constraint is satisfied. $\lambda(x)$ curve 42 lies along the value of $\lambda$ which gives a maximum value of absorbed dose in the resist. The value of $D(x)$ at the right hand side of $\lambda(x)$ curve 42 is the maximum value obtainable after apodization. As shown by FIG. 3, contour line 40 that defines $\lambda_d(x)$ for the present invention provides a constant dose $D(x)$ of a higher intensity than the maximum value obtainable after apodization under the prior art approach. Improvements of greater than 40% in the dose intensity are typical.

Another advantage of the collimator present invention is that it apodizes the collimated radiation without the use of additional apodizing films or plates. The collimator of the present invention is, therefore, self-apodizing.

Therefore, a self-apodizing collimator useful for VLSI X-ray lithography is described. The collimator provides uniform resist response while also providing collimated X-rays of higher intensity than previously possible.

What is claimed is:

1. A method for collimating isotropic X-Rays of a predetermined range of wavelengths, said method comprising the steps of:
   receiving said isotropic X-Rays on a paraboloidal surface;
   providing a graded multi-layer coating on said paraboloidal surface;
   collimating said isotropic X-Rays by selectively reflecting X-Rays of predetermined angles of incidence and a plurality of predetermined wavelengths from said graded multi-layer coating according to the incident location of said X-Rays on said graded multi-layer coating such that said collimated X-Rays provide a uniform dose rate.

2. The method of claim 1 further comprising the step of:
   providing a laser produced plasma source for providing said isotropic X-Rays.

3. The method of claim 1 wherein said predetermined range of wavelengths is 4 to 20 A.

4. The method of claim 3 wherein said graded multi-layer coating comprises alternating thin films of carbon and tungsten.

5. An apparatus for collimating X-Rays of a first predetermined range of wavelengths, said apparatus comprising:
   point source means for isotropically radiating said X-Rays;
   paraboloidal means for receiving said X-Rays, said point source means being placed substantially at the focus of said paraboloidal means; and
   graded coating means on the surface of said paraboloidal means for collimating said X-Rays, said graded coating means also for selectively reflecting X-Rays of predetermined angles of incidence and a plurality of predetermined wavelengths according to the incident location of said X-Rays on said graded coating means such that said collimated X-Rays provide a uniform dose rate.

6. The apparatus of claim 5 wherein said X-Rays of said first predetermined range of wavelengths have wavelengths of 4 to 20 A.

7. The apparatus of claim 5 wherein said graded coating means is a graded ML coating.

8. The apparatus of claim 7 wherein said graded ML coating comprises alternating thin films of carbon and tungsten.

9. An apparatus for collimating isotropic X-Rays of a predetermined range of wavelengths in a VLSI lithography system, said apparatus comprising:
   paraboloidal means for receiving said isotropic X-Rays;
   graded coating means on the surface of said paraboloidal means for collimating said X-Rays, said graded coating means also for selectively reflecting X-Rays of predetermined angles of incidence and a plurality of predetermined wavelengths according to the incident location of said X-Rays on said graded coating means;
   mask means for selectively transmitting said collimated X-Rays; and
   resist means for receiving said transmitted X-Rays and creating a latent image in said resist means in response to said transmitted X-Rays, said graded coating means also for causing said transmitted X-Rays to provide a uniform dose to said resist means.

10. The apparatus of claim 9 further comprising:
    point source means for providing said isotropic X-Rays.

11. The apparatus of claim 10 wherein said point source means is a laser produced plasma source and said predetermined range of wavelengths is 4 to 20 A.

12. The apparatus of claim 9 wherein said graded coating means is a graded multi-layer coating.

13. The apparatus of claim 12 wherein said graded coating multi-layer coating comprises alternating thin films of carbon and tungsten.

14. An apparatus for collimating X-Rays of a predetermined range of wavelengths in a VLSI lithography system, said apparatus comprising:
    point source means for isotropically radiating said X-Rays;
    paraboloidal means for receiving said X-Rays, said point source means being placed substantially at the focus of said paraboloidal means;
    graded coating means on the surface of said paraboloidal means for collimating said X-Rays, said graded coating means also for selectively reflecting X-Rays of predetermined angles of incidence and a plurality of predetermined wavelengths according to the incident location of said X-Rays on said graded coating means;
    mask means for selectively transmitting said collimated X-Rays; and
    resist means for receiving said transmitted X-Rays and creating a latent image in said resist means in response to said transmitted X-Rays, said graded coating means also for causing said transmitted X-Rays to provide a uniform dose to said resist means.

15. The apparatus of claim 14 wherein said X-Rays of said predetermined range of wavelengths have wavelengths of 4 to 20 A.

16. The apparatus of claim 14 wherein said graded coating means is a graded ML coating.

17. The apparatus of claim 16 wherein said graded ML coating comprises alternating thin films of carbon and tungsten.

18. An apparatus for collimating isotropic X-Rays of a predetermined range of wavelengths, said apparatus comprising:
receiving means for receiving said isotropic X-Rays, said receiving means having a paraboloidal surface; and
graded coating means for collimating said isotropic X-Rays, said graded coating means being placed on said paraboloidal surface, said graded coating means also for selectively reflecting X-Rays of predetermined angles of incidence and a plurality of predetermined wavelengths according to the incident location of said X-Rays on said graded coating means such that said collimated X-Rays provide a uniform dose rate.

19. The apparatus of claim 18 further comprising:
point source means for providing said isotropic X-Rays.

20. The apparatus of claim 19 wherein said point source means is a laser produced plasma source and said predetermined range of wavelengths is 4 to 20 A.

21. The apparatus of claim 18 wherein said graded coating means is a graded multi-layer coating.

22. The apparatus of claim 21 wherein said graded multi-layer coating comprises alternating thin films of carbon and tungsten.

23. An apparatus for collimating isotropic X-Rays of a predetermined range of wavelengths, said apparatus comprising:
a paraboloidal surface for receiving said isotropic X-Rays; and
a graded multi-layer coating on the surface of said paraboloidal surface, said graded multi-layer coating for collimating said isotropic X-Rays, said graded multi-layer coating being graded to selectively reflect X-Rays of predetermined angles of incidence and a plurality of predetermined wavelengths according to the incident location of said X-Rays on said graded multi-layer coating such that said collimated X-Rays provide a uniform dose rate.

24. The apparatus of claim 23 wherein said graded multi-layer coating comprises alternating thin films of carbon and tungsten.

25. The apparatus of claim 23 further comprising:
a point source for providing said isotropic X-Rays, said point source being located substantially at the focus of said paraboloidal surface.

26. The apparatus of claim 25 wherein said point source is a laser produced plasma source and said predetermined range of wavelengths is 4 to 20 A.

27. An apparatus for collimating isotropic X-Rays of a predetermined range of wavelengths in a VLSI lithography system, said apparatus comprising:
a point source for radiating said isotropic X-Rays;
a paraboloidal surface for receiving said isotropic X-Rays, said point source being placed substantially at the focus of said paraboloidal surface;
a graded multi-layer coating on the surface of said paraboloidal surface, said graded multi-layer coating for collimating said isotropic X-Rays, said graded multi-layer coating being graded to selectively reflect X-Rays of predetermined angles of incidence and a plurality of predetermined wavelengths according to the incident location of said X-Rays on said graded multi-layer coating;
a mask for selectively transmitting said collimated X-Rays; and
a resist for receiving said transmitted X-Rays and creating a latent image in said resist in response to said transmitted X-Rays, said graded multi-layer coating also for causing said transmitted X-Rays to provide a uniform dose to said resist.

28. The apparatus of claim 27 wherein said point source is a laser produced plasma source and said predetermined range of wavelengths is 4 to 20 A.

29. The apparatus of claim 27 wherein said graded multi-layer coating comprises alternating thin films of carbon and tungsten.

* * * * *